United States Patent [19]
Yajima et al.

[11] Patent Number: 5,345,080
[45] Date of Patent: Sep. 6, 1994

[54] METHOD OF OBSERVING ELECTRON MICROSCOPIC IMAGES AND AN APPARATUS FOR CARRYING OUT OF THE SAME

[75] Inventors: Yusuke Yajima, Kokubunji; Masakazu Ichikawa, Tokyo; Hiroyuki Shinada, Chofu, all of Japan

[73] Assignee: Hitachi, Ltd., Tokyo, Japan

[21] Appl. No.: 960,503

[22] Filed: Oct. 13, 1992

[30] Foreign Application Priority Data

Oct. 15, 1991 [JP] Japan ............................ 3-266075

[51] Int. Cl.$^5$ ............................................ H01J 37/295
[52] U.S. Cl. ................................. 250/311; 250/397
[58] Field of Search ............... 250/306, 307, 311, 397

[56] References Cited
U.S. PATENT DOCUMENTS

| | | | |
|---|---|---|---|
| 2,991,361 | 7/1961 | Herrmann | 250/397 |
| 3,628,012 | 12/1971 | Plows et al. | |
| 3,917,946 | 11/1975 | van Oostrum | 250/397 |
| 4,366,380 | 12/1982 | Mirkin | 250/306 |
| 4,399,360 | 8/1983 | Fotino | 250/397 |
| 4,712,057 | 12/1987 | Pau | 250/311 |
| 5,004,918 | 4/1991 | Tsuno et al. | 250/311 |
| 5,153,434 | 10/1992 | Yajima | 250/442.11 |

*Primary Examiner*—Bruce C. Anderson
*Attorney, Agent, or Firm*—Fay, Sharpe, Beall, Fagan, Minnich & McKee

[57] ABSTRACT

An electron microscopic image observing method and an apparatus for carrying out the same enables the observation of an electron microscopic image of a specimen by irradiating the specimen with an electron beam and detecting the electron beam after it has transmitted through the specimen. The electron beam transmitted through the specimen is deflected so that the deflection thereof varies with time, and is allowed to pass through an aperture only when the deflection thereof is within a predetermined range of deflection, whereby the electron beam transmitted through the specimen and passed through the aperture is then detected. Thus, the electron microscopic image observing method and the apparatus for carrying out the same enables the observation of time-resolved electron microscopic images of a specimen having internal physical properties varying with time.

34 Claims, 4 Drawing Sheets

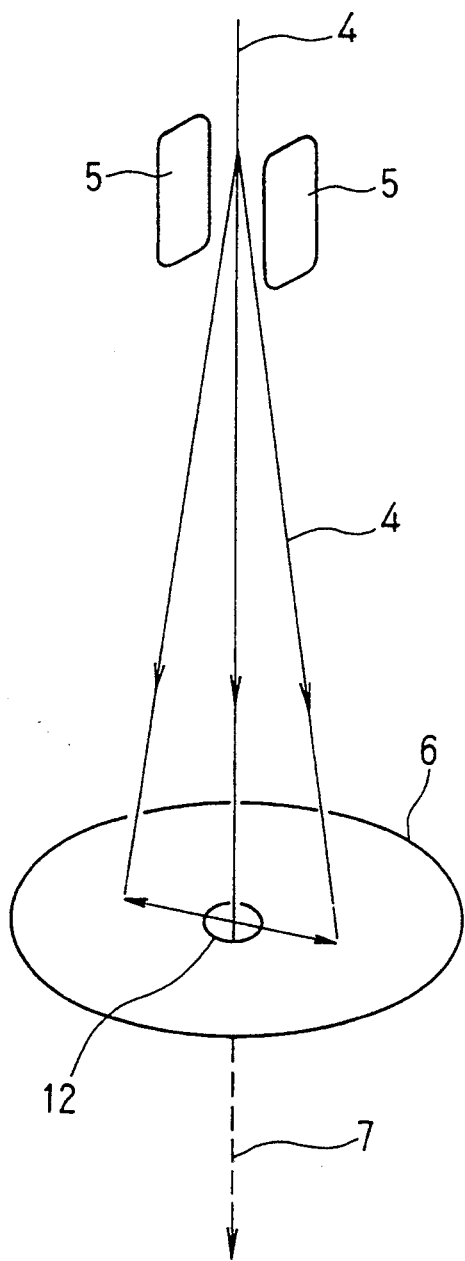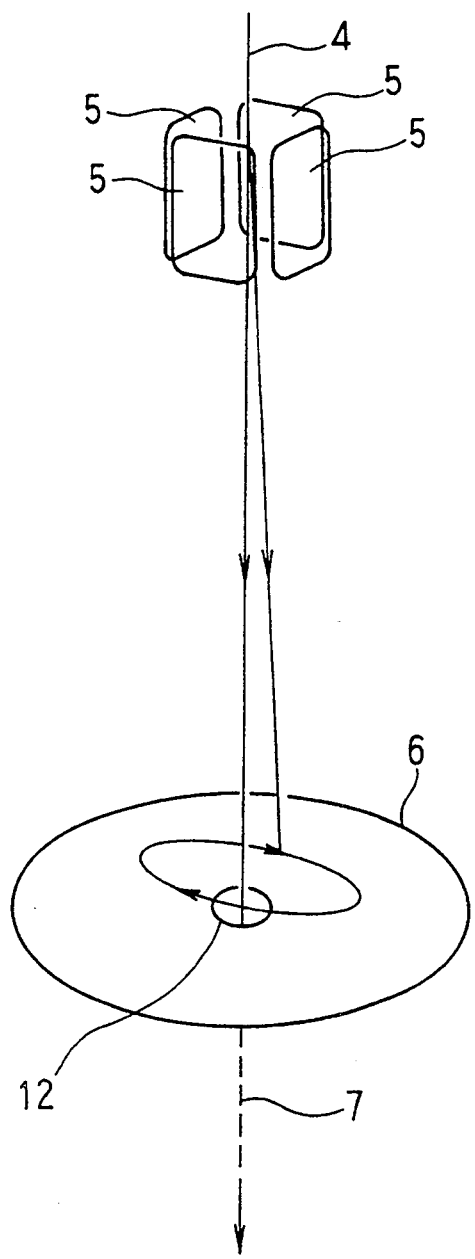

METHOD OF OBSERVING ELECTRON MICROSCOPIC IMAGES AND AN APPARATUS FOR CARRYING OUT OF THE SAME

BACKGROUND OF THE INVENTION

The present invention relates to a method of observing electron microscopic images and an apparatus for carrying out the same and, more particularly, to a method of observing electron microscopic images, enabling temporally-resolved observation of time-varying properties and conditions of the interior or skin layer of a specimen by passing an electron beam through the interior or the skin layer of the specimen, and an electron microscopic image observing apparatus for carrying out the method.

A prior art method of observing the time variation of the properties and conditions of the interior of a specimen by an electron microscopic image observing apparatus, such as disclosed in U.S. Pat. No. 3,628,012, transmits an intermittent electron beam through a specimen and observes the quantitative variation of actions experienced by the intermittent electron beam.

To emit an intermittent electron beam, this prior art method needs to interrupt an electron beam in the neighborhood of an electron gun provided with a high-voltage applying means of a complicated construction for accelerating electrons, requiring the interior thereof to be held in a high vacuum. An electron beam irradiation system having a high-precision construction and which is highly sensitive to electromagnetic noise is also necessary. Accordingly, the prior method needs an electron beam interrupting means comprising a deflecting coil, an aperture diaphragm and the like, which is disposed in the neighborhood of the electron gun and the electron beam irradiation system. However, the installation of the electron beam interrupting means near the electron gun and the electron beam irradiation system requires considerable modification of the apparatus and introduction of additional functions into the apparatus.

As stated above, the prior art method of observing time-resolved electron microscopic images needs an electron microscopic image observing apparatus of a construction greatly different from that of a general electron microscopic image observing apparatus which is not intended for the observation of time-resolved electron microscopic images. Thus, the prior art method cannot be carried out by a simple modification of the prevailing electron microscopic image observing apparatus.

SUMMARY OF THE INVENTION

Accordingly, it is an object of the present invention to provide a method of observing time-resolved electron microscopic images, which is capable of being carried out by a prevailing electron microscopic image observing apparatus incorporating simple modifications and additional functions without deteriorating the original functions and accessibility of the electron microscopic image observing apparatus, and an electron microscopic image observing apparatus for carrying out the method.

A method of observing time-resolved electron microscopic images in one aspect of the present invention interrupts an electron beam transmitted through a specimen of through the vicinity of the specimen (hereinafter referred to as "transmitted electron beam") by an electron beam interrupting means comprising, in combination, a deflector and an aperture diaphragm disposed behind the deflector before the transmitted electron beam falls on a detector to make the transmitted electron beam fall on the detector only in time intervals optionally specified for the observation of the time-resolved electron microscopic images.

This method enables the observation of time-resolved electron microscopic images without requiring any modification in the electron gun and the electron beam irradiation system, which are subject to severe restrictions concerning degree of vacuum, electromagnetic noise and construction, by a general electron microscopic image observing apparatus incorporating only an electron beam interrupting means, restrictions on which are not very severe, disposed on the path of the transmitted electron beam. Accordingly, the present invention enables the simple, easy observation of time-resolved electron microscopic images by a general electron microscopic image observing apparatus not intended for the observation of time-resolved electron microscopic images by incorporating simple modifications and additional functions without deteriorating the original functions and accessibility of the general electron microscopic image observing apparatus.

The above and other objects, features and advantages of the present invention will become more apparent from the following description taken in connection with the accompanying drawings.

BRIEF DESCRIPTION OF THE DRAWINGS

FIG. 3 is a diagrammatic view that assists in explaining a method of generating an intermittent electron beam to be employed in the electron microscopic image observing method;

FIG. 4 is a diagrammatic view that assists in explaining another method of generating an intermittent electron beam to be employed in the electron microscopic image observing method;

DESCRIPTION OF THE PREFERRED EMBODIMENTS

Figure 1:
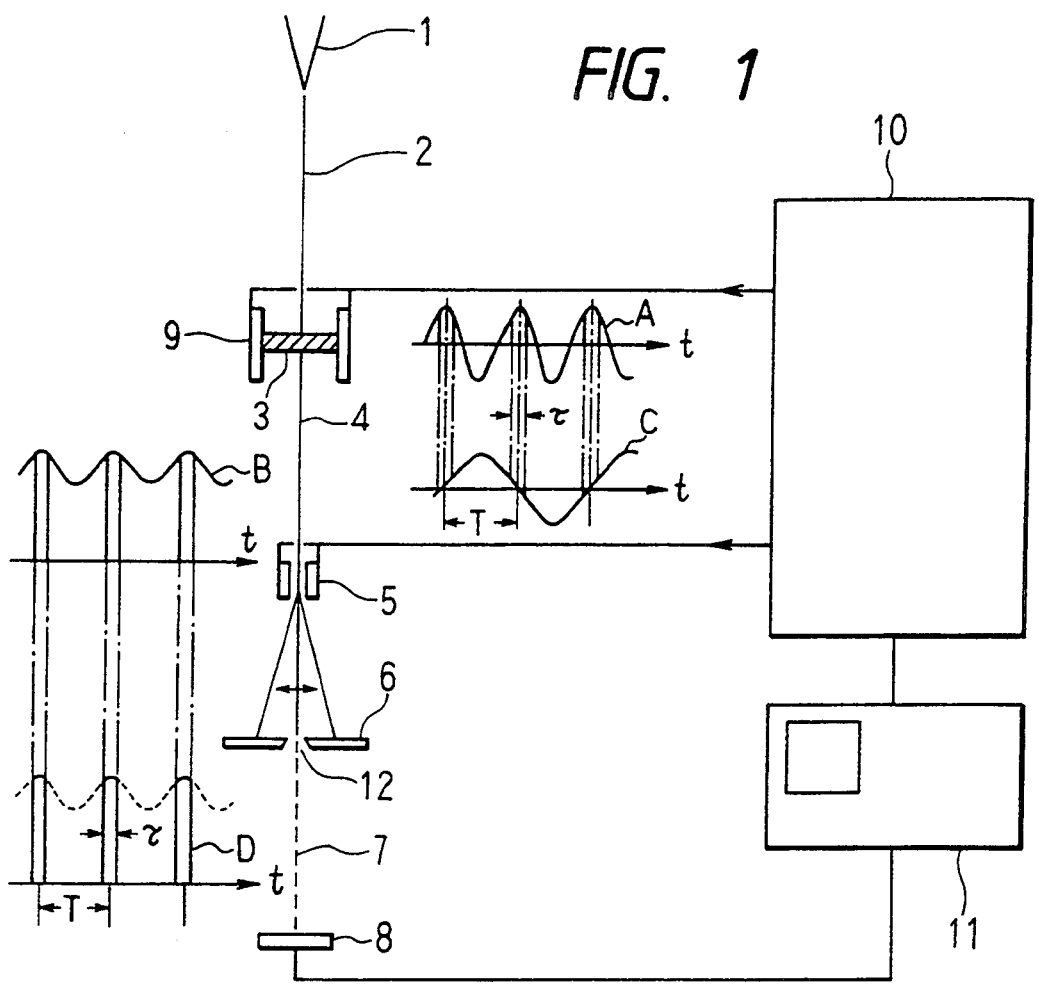
FIG. 1 is a diagrammatic view of an electron microscopic image observing apparatus suitable for carrying out an electron microscopic image observing method embodying the present invention.

FIG. 1 shows an electron microscopic image observing apparatus suitable for carrying out an electron microscopic image observing method embodying the present invention, in which electron beam control systems for regulating an electron beam in a desired sectional shape and intensity, and a position control system for selectively determining a position to be irradiated with the electron beam 2 on the specimen 3, are omitted from the drawing. Referring to FIG. 1, a specimen 3 is irradiated with an irradiating electron beam 2 emitted by an electron gun 1. A transmitted electron beam 4 transmitted through the specimen 3 is deflected periodically for scanning by an electrostatic or magnetic deflector 5 and, consequently, the transmitted electron beam 4 passes an aperture 12 formed in an aperture diaphragm 6 intermittently and an intermittent transmitted electron beam 7 falls on a detector 8.

Periodically varying static or dynamic perturbation produced by an electric field, a magnetic field current, stress, heat, a particle beam, an electromagnetic radiation, light or the like is applied to the specimen 3 by a coupler 9. The periodic perturbation applied to the specimen 3 by the coupler 9 and the periodic deflection of the transmitted electron beam 4 by the deflector 5 are synchronized by a control unit 10. Detection signals provided by the detector 8 and control data provided by the control unit 10 are processed to obtain information concerning the properties of the specimen 3 by a data processing/displaying unit 11 and the information thus obtained is displayed by the same.

Thus, the information conveyed only by the intermittent transmitted electron beam 7, i.e., the information concerning the properties of the interior of the specimen 3 at a specific time when a specific quantity of perturbation is applied to the specimen 3 in each cycle of application of the periodic perturbation to the specimen 3, is extracted to enable the observation of time-resolved electron microscopic images of the interior of the specimen 3.

The electron microscopic image observing method will be described further in detail hereinafter.

The coupler 9 applies a perturbation varying at a period T to the specimen 3 as indicated by a curve A in FIG. 1; consequently, the information conveyed by the transmitted electron beam 4 varies at a period T as indicated by a curve B in FIG. 1. The aperture 12 is formed so that the transmitted electron beam 4 is able to pass the aperture 12 only when the deflection angle of the transmitted electron beam 4 is within a small angular range of the straight-line path of the transmitted electron beam 4 corresponding to a deflection angle of 0°. The transmitted electron beam 4 is deflected by the deflector 5 so as to oscillate at a period 2T as indicated by a curve C in FIG. 1 between predetermined equal deflection angles on the opposite sides of the straight-line path of the transmitted electron beam 4 corresponding to a deflection angle of 0°. The phase difference between the periodically varying perturbation (curve A) and the oscillatory deflection of the transmitted electron beam 4 (curve C) is adjusted properly so that the transmitted electron beam 4 is able to travel through the aperture 12 only while the perturbation acting on the specimen 3 is in a specific phase range of a time interval $\tau$ in each period T to make the intermittent transmitted electron beam 7 indicated by a curve D fall on the detector 8.

Figure 2:
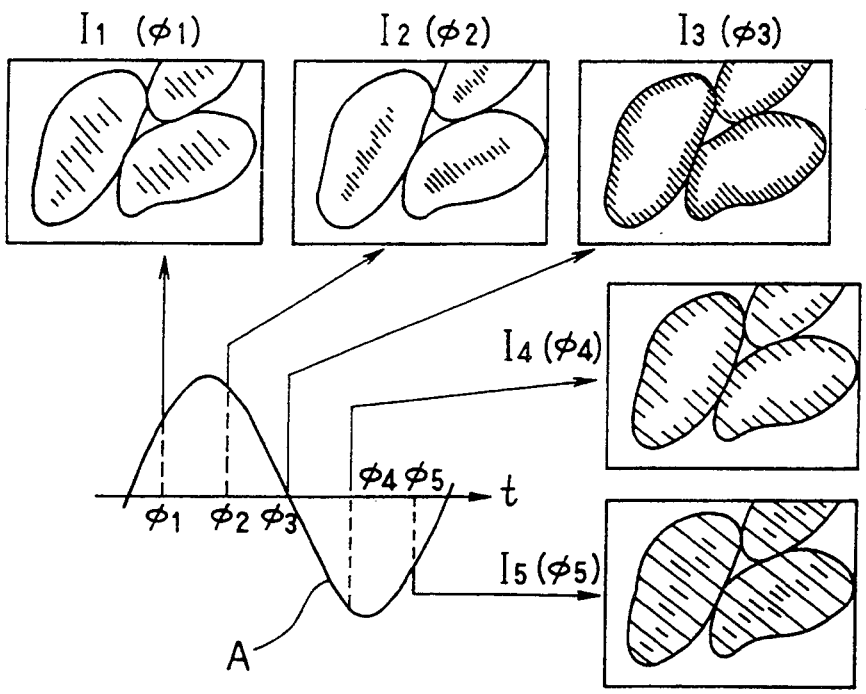
FIG. 2 illustrates a mode of application of the electron microscopic image observing method.

FIG. 2 shows examples of the information concerning the properties of the interior of the specimen 3, namely, electron microscopic images, observed by the method. The morphology of the electron microscopic images is dependent on the intensity of the periodically varying perturbation applied to the specimen 3, namely, the phase of the perturbation periodically varying at the period T when the transmitted electron beam 4 is allowed to travel through the aperture 12 and the intermittent transmitted electron beam 7 falls on the detector 8. Suppose that a perturbation periodically varying as indicated by a curve A in FIG. 2 is applied to the specimen 3. Then, a time-resolved electron microscopic image $I_1(\phi_1)$ is obtained if the intermittent transmitted electron beam 7 falls on the detector 8 when the perturbation is in a phase $\phi_1$. Similarly, time-resolved electron microscopic images $I_2(\phi_2)$, $I_3(\phi_3)$, $I_4(\phi_4)$ and $I_5(\phi_5)$ can be obtained when the phase difference is adjusted so that the intermittent transmitted electron beam 7 falls on the detector 8 when the perturbation is in phases $\phi_2$, $\phi_3$, $\phi_4$ and $\phi_5$, respectively. Thus the electron microscopic image observing method enables the observation of time-resolved internal properties of a specimen having internal properties varying with time. In the foregoing description, the periodically varying perturbation is applied to the specimen 3 by the coupler 9 to make the internal properties of the specimen 3 vary periodically. However, the electron microscopic image observing method is applicable to the time-resolved observation of a specimen having spontaneously and periodically variable internal properties.

A method of producing the intermittent transmitted electron beam 7 by the cooperative agency of the deflector 5 and the aperture 12 will be described further in detail with reference to FIGS. 3 and 4.

Referring to FIG. 3, when producing the intermittent transmitted electron beam 7 by deflecting the transmitted electron beam 4 in a uniaxial deflection mode, the deflector 5 deflects the transmitted electron beam 4 uniaxially so that the deflection angle varies periodically. Then, the transmitted electron beam 4 reciprocates along a straight, linear deflection path extending on the surface of the aperture diaphragm 6 across the aperture 12, and the transmitted electron beam 4 passes across the aperture 12 twice in each reciprocation. Therefore, the intermittent transmitted electron beam 7 of period T can be produced by properly adjusting the positional relation between the position of the straight-line path of the transmitted electron beam 4 on the deflection path and the position of the center of the aperture 12, and the waveform of a deflection signal of period 2T to be applied to the deflector 5. For example, the transmitted electron beam 4 is deflected in a sinusoidal curve of period 2T by applying a sinusoidal deflection signal of period 2T to the deflector 5 when the straight-line path of the transmitted electron beam 4 is aligned with the center of the aperture 12. The intermittent transmitted electron beam 7 of period T equal to that of the period of deflection can be produced by applying a deflection signal of period T to the deflector 5 when either of the opposite terminal points of the deflection path of the transmitted electron beam is aligned with the center of the aperture 12 so that the transmitted electron beam 4 passes the aperture 12 once in each period T of deflection.

Referring to FIG. 4, the intermittent electron beam 4 is deflected in a biaxial deflection mode to produce the intermittent transmitted electron beam 7 by a first deflector 5 for deflecting the transmitted electron beam 4 along a first axis and a second deflector 5 for deflecting the transmitted electron beam 4 along a second axis. When the period T of a first deflection signal applied to the first deflector 5 and the period T of a second deflection signal applied to the second deflector 5 are equal to each other and the phase difference between the first and second deflection signals is determined properly, the transmitted electron beam 4 moves periodically along a closed deflection path, such as a circular deflection path, on the surface of the aperture diaphragm 6. When the positional relation between the deflectors 5 and the aperture diaphragm 6, and the phase difference are determined so that a portion of the closed deflection path extends across the aperture 12 and the transmitted electron beam 4 moves along the closed deflection path at the period T, the transmitted electron beam 4 passes the aperture 12 once in the period T to produce the intermittent transmitted electron beam 7 of period T. The figure of the closed deflection path is, for example, a Lissajous figure or a rectangular figure.

The foregoing electron microscopic image observing method of the present invention thus enables the time-resolved observation of conventional projection transmission electron microscopic images (PTEM images). A method of observing scanning transmission electron microscopic images (STEM images), particularly, a method of observing the time-resolved distribution of intensity of a magnetic field within the specimen by a Lorentz scanning transmission electron microscope (Lorentz STEM) which enables the observation of the time-resolved distribution of intensity of a magnetic field created within the specimen, on the basis of the deflection of the electron beam caused by a Lorentz force exerted on the electron beam by the magnetic field created in the specimen while the electron beam is transmitted through the specimen, will be described hereinafter with reference to FIGS. 5 and 6.

Figure 5:
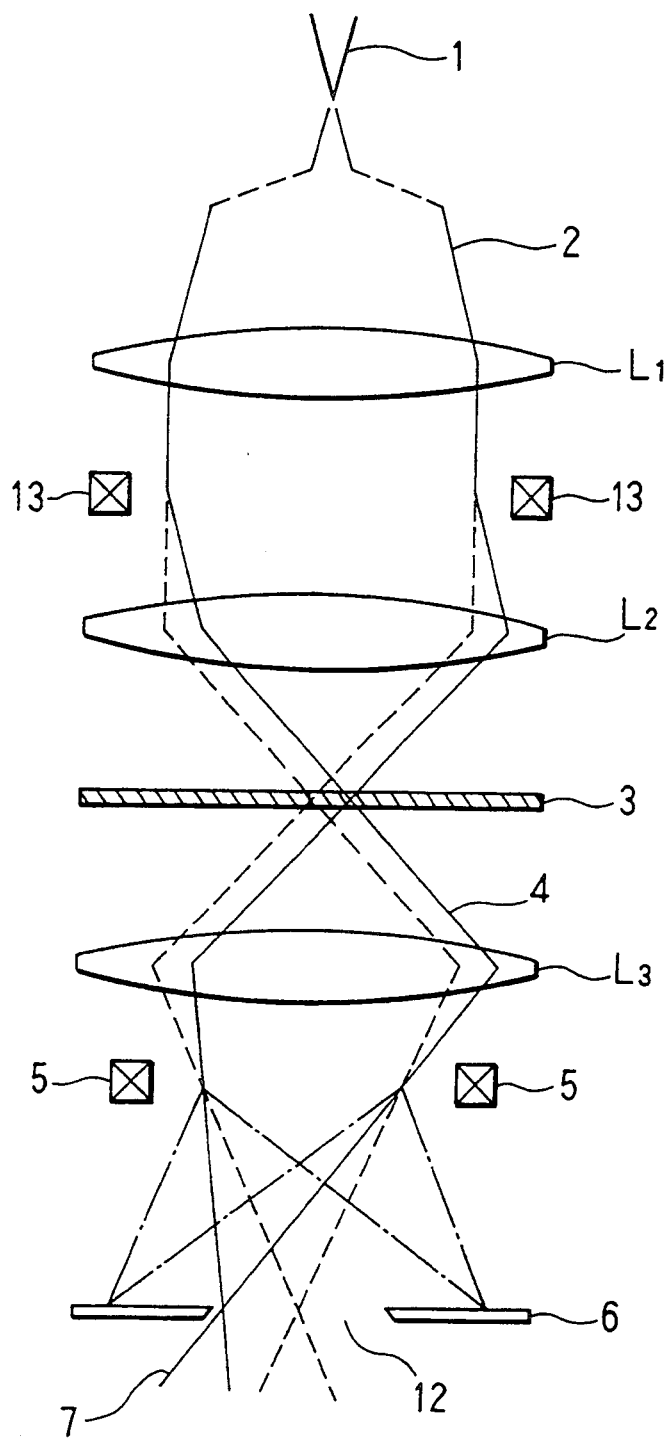
FIG. 5 is a diagrammatic view that assists in explaining a procedure of setting conditions for the observation of a magnetic field created within a specimen by the electron microscopic image observing method.

Generally, when observing a STEM image, an irradiating electron beam 2 emitted by an electron gun 1 is focused on a specimen 3 for irradiation. An electron optical system for focusing the irradiating electron beam 2 on the specimen 3 shown in FIG. 5 comprises lenses $L_1$ and $L_2$. When observing a STEM image, a portion of the specimen 3 must be scanned two-dimensionally with the focused electron beam 2. In FIG. 5, the irradiating electron beam 2 is deflected by a scanning coil 13 interposed between the lenses $L_1$ and $L_2$ for two-dimensional scanning.

A transmitted electron beam 4 transmitted through the specimen 3 is focused by an objective lens $L_3$ and deflected periodically by a deflector 5 for scanning so that the transmitted electron beam 4 is able to pass an aperture 12 only in a predetermined time interval in each cycle of deflection to produce an intermittent transmitted electron beam 7. An image forming electron optical system, not shown, is disposed after the deflector 5 with respect to the direction of travel of the intermittent transmitted electron beam 7 to form an image of an optimum magnification on a detector 8 by the intermittent transmitted electron beam 7. When the irradiating electron beam 2 is condensed by the lens $L_1$, and the scanning coil 13 is disposed with its deflection surface coinciding with the front focal plane of the lens $L_2$, the influence of the slant of the irradiating electron beam 2 deflected by the scanning coil 13 is negligible.

Under those conditions, the spot of the transmitted electron beam 4 formed on the back focal plane of the objective lens $L_3$ does not move even if the spot of the irradiating electron beam is moved on the specimen 3, when no magnetic field is created within the specimen 3. Accordingly, when the deflector 5 is disposed with its deflection plane coinciding with the back focal plane of the objective lens $L_3$ and an image having an object plane corresponding to the back focal plane of the objective lens $L_3$ is formed on the detecting surface of the detector 8 by the image forming electron optical system, the spot of the intermittent transmitted electron beam 7 focused on the detecting surface does not move even if the irradiating electron beam 2 is deflected for scanning by the scanning coil 13 and the transmitted electron beam 4 is deflected by the deflector 5, when no magnetic field is present within the specimen 3.

On the other hand, when a magnetic field is present within the specimen 3, the transmitted electron beam 4 is deflected by a Lorentz force exerted thereon by the magnetic field when the irradiating point of the irradiating electron beam 2 coincides with a position within the magnetic field, so that the spot of the transmitted electron beam 4 formed on the back focal plane of the objective lens $L_3$ moves, and hence the spot of the intermittent transmitted electron beam 7 formed on the detecting surface of the detector 8 moves accordingly. Therefore, information concerning the direction and intensity of the magnetic field created within the specimen 3 can be acquired by analyzing data obtained by detecting the direction and quantity of movement of the spot of the intermittent transmitted electron beam 7 on the detecting surface of the detector 8. Furthermore, the two-dimensional distribution of the intensity of the magnetic field created within the specimen 3 can be observed by displaying the data of the direction and intensity of the magnetic field created within the specimen 3 in connection with the scanning signals applied to the scanning coil 13, namely, data representing the irradiating point of the irradiating electron beam 2. This method is called the Lorentz STEM method.

The following description is connected with the observation of direction and intensity of the magnetic field created within the specimen when the direction and intensity of the magnetic field and the two-dimensional distribution thereof vary periodically with time. As stated above, when observing the periodic variation of the magnetic field created within the specimen, the phase of the periodic deflection of the transmitted electron beam 4 by the deflector 5 is shifted relative to the periodic variation of the magnetic field created within the specimen to shift the phase of the intermittent transmitted electron beam 7 passing the aperture 12 in each cycle of the periodic variation of the magnetic field. Then, as explained with reference to FIG. 2, it is possible to observe the time-resolved distribution of the magnetic field periodically varying with time. When it is desired to observe the variation of the magnetic field created within the specimen 3 at a specific point within the specimen 3, the mode of variation of the direction and intensity of the magnetic field at the specific point can be observed by fixing the irradiating point of the irradiating electron beam 2 at the specific point and gradually shifting the phase of the deflection of the transmitted electron beam 4 deflected by the deflector 5.

If it is difficult to dispose the scanning coil 13 and the deflector 5 with their deflection planes coinciding with the front focal plane of the lens $L_2$ and the back focal plane of the objective lens $L_3$, respectively, it is possible to dispose the scanning coil 13 and the deflector 5 so that the deflection plane of the scanning coil 13 coincides with the object plane of the lens system consisting of the lens $L_2$ and the objective lens $L_3$, and the deflection plane of the deflector 5 coincides with the object plane of the lens system. In either case, it is desirable to dispose the aperture diaphragm 6 so that a plane including the aperture 12 and the specimen 3 (observation plane) are conjugate with respect to the lens system consisting of the lens $L_2$ and the objective lens $L_3$.

Figure 6:
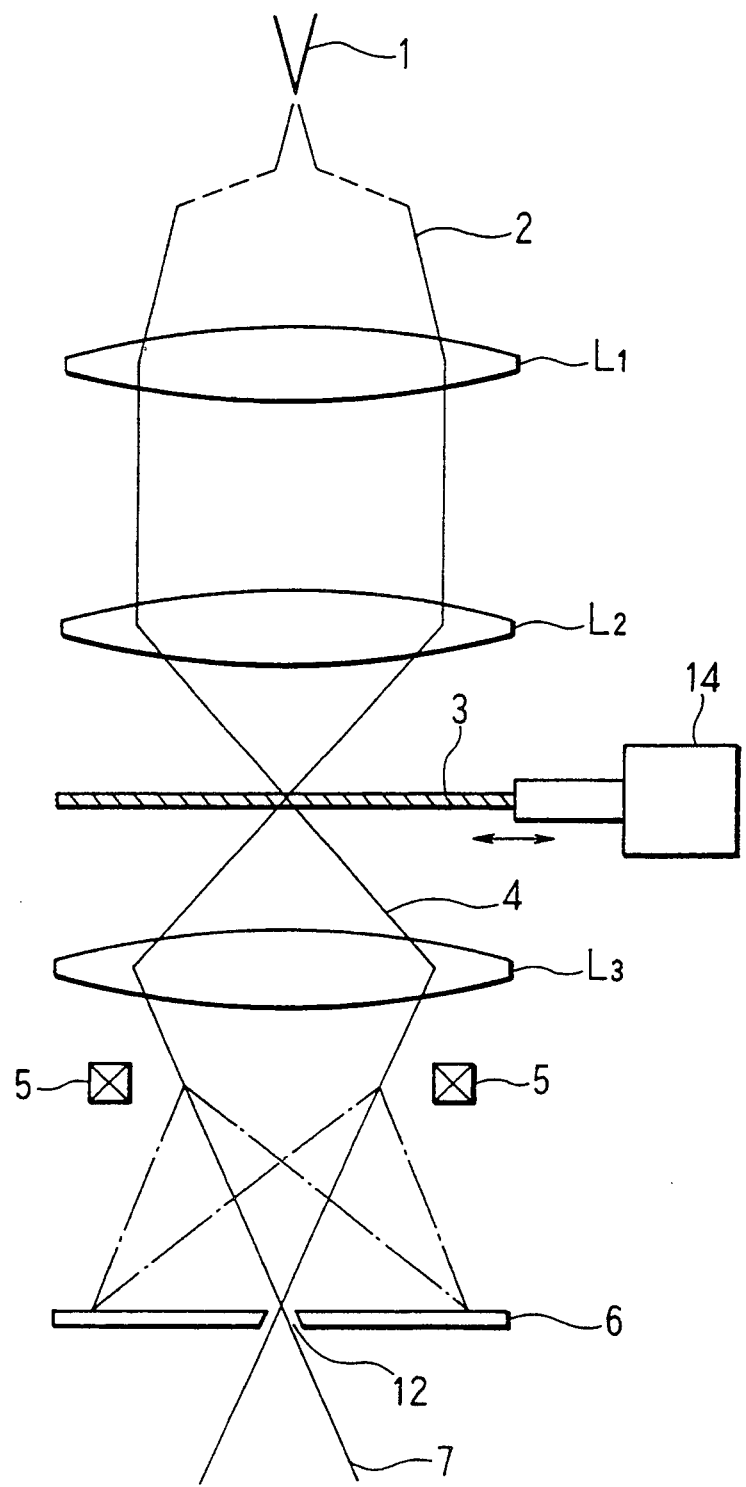
FIG. 6 is a diagrammatic view that assists in explaining another procedure of setting conditions for the observation of a magnetic field created within a specimen by the electron microscopic image observing method.

When moving the irradiating point of the irradiating electron beam 2 for two-dimensional scanning on the specimen 3, the specimen 3 may be moved minutely for scanning by a specimen moving mechanism 14 as shown in FIG. 6 instead of deflecting the irradiating electron beam 2 by the scanning coil 13 as shown in FIG. 5. When the arrangement shown in FIG. 6 is employed for the two-dimensional scanning of the specimen 3 and an image having its object plane coinciding with the deflection plane of the deflector 5 is formed on the detecting surface of the detector 8 by an image forming electron optical system, the spot of the intermittent transmitted electron beam 7 focused on the detecting surface of the detector 8 does not move even if the transmitted electron beam 4 is deflected by the deflector 5, when no magnetic field is created within the specimen 3.

On the other hand, the spot of the intermittent transmitted electron beam 7 moves on the detecting surface of the detector 8 when a magnetic field is created within the specimen 3, because the transmitted electron beam 4 is deflected by the magnetic field created within the specimen 3. Accordingly, the method employing the arrangement shown in FIG. 6, similarly to the method employing the arrangement shown in FIG. 5, is able to obtain information concerning the direction and intensity of the magnetic field created within the specimen 3 from data representing the direction and distance of movement of the spot of the intermittent transmitted electron beam 7 on the detecting surface of the detector 8.

A two-dimensional image showing the two-dimensional distribution of intensity of the magnetic field created within the specimen 3 can thus be formed and displayed by minutely moving the specimen 3 relative to the irradiating electron beam 2 by the specimen moving mechanism 14, measuring the data of the magnetic field at a plurality of optional positions on the specimen 3 and displaying the data in connection with the corresponding positions on the specimen 3. Furthermore, the time-resolved observation of the variation of the magnetic field created within the specimen 3 can be achieved by shifting the phase of the periodic deflection of the transmitted electron beam 4 by the deflector 5 relative to the periodic variation of the magnetic field created within the specimen 3, which is similar to the method employing the arrangement shown in FIG. 5.

In FIG. 6, it is desirable to dispose the aperture diaphragm 6 in the back focal plane of the objective lens $L_3$. The arrangement shown in FIG. 6 which moves the specimen 3 for scanning is advantageous, as compared with the arrangement shown in FIG. 5 which moves the irradiating electron beam 2 for scanning, in that the electron optical system can be set under less stringent setting conditions because the irradiating electron beam 2 need not be deflected for scanning, and the size of the aperture 12 may be smaller than that of the aperture 12 of the arrangement shown in FIG. 5.

The electron microscopic image observing methods of the present invention described hereinbefore are also applicable, for example, to the observation of the quality of a region surrounding the specimen, such as a stray magnetic field, as well as to the observation of the internal quality and state of the specimen, such as a magnetic field present within the specimen.

As is apparent form the foregoing description, the electron microscopic image observing method of the present invention facilitates the time-resolved observation of the internal quality and state of a specimen varying with time by using a conventional electron microscopic image observing apparatus incorporating simple modifications and additional functions, without deteriorating the original functions and accessibility of the conventional electron microscopic image observing apparatus. The electron microscopic image observing method of the present invention is effective particularly for the observation of a magnetic field created within a specimen and varying with time. Furthermore, the electron microscopic image observing method of the present invention is applicable to the observation of the quality and state of a region surrounding a specimen as well as to the observation of the internal quality and state of the specimen.

What is claimed is:

1. In an electron microscopic image observing method, wherein an electron beam is emitted so that the electron beam will pass through a specimen or through a region surrounding the specimen, and thereafter detected to form an electron microscopic image of the specimen, the improvement comprising the steps of:
   deflecting the electron beam after having transmitted through the specimen so that the deflection of the electron beam varies with time; and
   selectively allowing the electron beam having transmitted through the specimen to pass intermittently through an aperture only when the deflection of the electron beam transmitted through the specimen is within a predetermined range of deflection;
   wherein the electron beam is detected to form a time-resolved electron microscopic image after having transmitted through the specimen and passed intermittently through the aperture.

2. An electron microscopic image observing method according to claim 1, wherein a perturbation varying with time is applied to the specimen.

3. An electron microscopic image observing method according to claim 2, wherein the perturbation applied to the specimen is at least one perturbation selected from the group consisting of an electric field, a magnetic field, a current, a stress, heat, a particle beam, an electromagnetic wave and light.

4. An electron microscopic image observing method according to claim 3, wherein the deflection of the electron beam having transmitted through the specimen is within the predetermined range of deflection when the magnitude of the perturbation applied to the specimen coincides with a predetermined magnitude.

5. An electron microscopic image observing method according to claim 3, wherein the magnitude of the perturbation applied to the specimen is varied periodically.

6. An electron microscopic image observing method according to claim 3, wherein the deflecting step is performed so that the deflection of the electron beam transmitted through the specimen is varied periodically.

7. An electron microscopic image observing method according to claim 3, wherein the electron beam is converged before passing through the specimen or through the region surrounding the specimen.

8. An electron microscopic image observing method according to claim 2, wherein the deflection of the electron beam having transmitted through the specimen is within the predetermined range of deflection when the magnitude of the perturbation applied to the specimen coincides with a predetermined magnitude.

9. An electron microscopic image observing method according to claim 8, wherein the magnitude of the perturbation applied to the specimen is varied periodically.

10. An electron microscopic image observing method according to claim 8, wherein the deflecting step is performed so that the deflection of the electron beam transmitted through the specimen is varied periodically.

11. An electron microscopic image observing method according to claim 8, wherein the electron beam is converged before passing through the specimen or through the region surrounding the specimen.

12. An electron microscopic image observing method according to claim 2, wherein the magnitude of the perturbation applied to the specimen is varied periodically.

13. An electron microscopic image observing method according to claim 12, wherein the deflecting step is performed so that the deflection of the electron beam transmitted through the specimen is varied periodically.

14. An electron microscopic image observing method according to claim 12, wherein the electron beam is converged before passing through the specimen or through the region surrounding the specimen.

15. An electron microscopic image observing method according to claim 2, wherein the deflection of the electron beam transmitted through the specimen is varied periodically.

16. An electron microscopic image observing method according to claim 15, wherein the period of detection of the electron beam transmitted through the specimen and selectively allowed to pass through the aperture is equal to that of the periodic variation of the perturbation applied to the specimen.

17. An electron microscopic image observing method according to claim 16, wherein the period of variation of the deflection of the electron beam transmitted through the specimen is equal to that of the periodic variation of the perturbation applied to the specimen.

18. An electron microscopic image observing method according to claim 17, wherein the electron beam is converged before passing through the specimen or through the region surrounding the specimen.

19. An electron microscopic image observing method according to claim 16, wherein the electron beam is converged before passing through the specimen or through the region surrounding the specimen.

20. An electron microscopic image observing method according to claim 2, wherein the electron beam is converged before passing through the specimen or through the region surrounding the specimen.

21. An electron microscopic image observing method according to claim 1, wherein the deflecting step is performed so that the deflection of the electron beam transmitted through the specimen is varied periodically.

22. An electron microscopic image observing method according to claim 21, wherein the electron beam is converged before passing through the specimen or through the region surrounding the specimen.

23. An electron microscopic image observing method according to claim 1, wherein the electron beam is converged before passing through the specimen or through the region surrounding the specimen.

24. An electron microscopic image observing method according to claim 23, wherein the deflecting step is performed so that the converged electron beam having transmitted through the specimen or through the region surrounding the specimen scans the entire area to be scanned within the specimen or within the region surrounding the specimen.

25. An electron microscopic image observing apparatus which irradiates a specimen with a converged electron beam, detects the electron beam transmitted through the specimen and forms an electron microscopic image of the specimen for observation, said electron microscopic image observing apparatus comprising:
  a deflector for periodically deflecting the electron beam having transmitted through the specimen;
  an aperture diaphragm having an aperture and disposed so as to allow the electron beam to pass intermittently through the aperture only when the deflection of the electron beam is within a predetermined range of deflection; and
  detecting means for detecting the electron beam having passed intermittently through the aperture.

26. An electron microscopic image observing apparatus according to claim 25, further comprising a scanning means for moving a position to be irradiated with the electron beam on the surface of ht specimen for scanning.

27. An electron microscopic image observing apparatus according to claim 26, wherein said scanning means is an electrostatic or magnetic electron beam deflecting means.

28. An electron microscopic image observing apparatus according to claim 27 further comprising a perturbing means for applying a perturbation to the specimen.

29. An electron microscopic image observing apparatus according to claim 26, wherein said scanning means is a specimen moving means for moving the specimen relative to the electron beam.

30. An electron microscopic image observing apparatus according to claim 29 further comprising a perturbing means for applying a perturbation to the specimen.

31. An electron microscopic image observing apparatus according to claim 26 further comprising a perturbing means for applying a perturbation to the specimen.

32. An electron microscopic image observing method according to claim 25 further comprising a perturbing means for applying a perturbation to the specimen.

33. An electron microscopic image observing apparatus according to claim 32, wherein said perturbing means is capable of applying a perturbation, the magnitude of which varies with time, to the specimen.

34. An electron microscopic image observing apparatus according to claim 33, wherein the magnitude of the perturbation varies periodically with time.

* * * * *